US006500700B1

(12) United States Patent
Kawai

(10) Patent No.: US 6,500,700 B1
(45) Date of Patent: Dec. 31, 2002

(54) FABRICATION METHOD OF LIQUID CRYSTAL DISPLAY

(75) Inventor: Satoru Kawai, Yonago (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/675,124

(22) Filed: Sep. 28, 2000

(30) Foreign Application Priority Data

Nov. 1, 1999 (JP) ............................................ 11-311573

(51) Int. Cl.[7] .......................... H01L 21/84; H01L 29/04; H01L 29/76
(52) U.S. Cl. ........................ 438/149; 438/151; 438/153; 438/154; 438/159; 257/59; 257/66
(58) Field of Search ............................ 438/149, 60, 75, 438/66, 30, 150–164, 144; 257/59, 72, 66; 349/42, 43, 187

(56) References Cited

U.S. PATENT DOCUMENTS

| | | | |
|---|---|---|---|
| 5,086,009 A | * | 2/1992 | Sangouard .................... 257/84 |
| 5,212,575 A | * | 5/1993 | Kojima et al. ............... 349/106 |
| 5,270,229 A | * | 12/1993 | Ishihara ....................... 205/102 |
| 5,650,867 A | * | 7/1997 | Kojima et al. ............... 349/104 |
| 5,851,918 A | * | 12/1998 | Song et al. .................. 349/152 |
| 6,081,310 A | * | 6/2000 | Katsuya et al. ............. 349/113 |
| 6,319,741 B1 | * | 11/2001 | Izumi et al. ................... 438/30 |

FOREIGN PATENT DOCUMENTS

| | | | | |
|---|---|---|---|---|
| JP | 58123516 | * | 7/1983 | ........... G02F/1/133 |
| JP | 10092830 | * | 4/1998 | ......... H01L/21/321 |
| JP | 10096812 | * | 4/1998 | ............ G02B/5/20 |

* cited by examiner

*Primary Examiner*—Wael Fahmy, Jr.
(74) *Attorney, Agent, or Firm*—Greer, Burns & Crain, Ltd.

(57) ABSTRACT

An object of the present invention is to provide a fabrication method of a liquid crystal display which can reduce the number of masks used in a photolithography process. According to this structure, a gate bus line and a storage capacitor wiring are formed using a first mask, and first metal films are formed on the whole surface including a sidewall insulating film. Then, etching is performed using a second mask until an active semiconductor layer in a TFT forming area on the gate bus line and in an element separation area between pixels exposes. Along with an electroplating of a metal film on the first metal films on a drain electrode, a third metal film thinner than the second metal film is formed on an active semiconductor between the drain electrode and a source electrode and to a pixel electrode except the element separation area between pixels. Finally, using a third metal film as a mask, the third metal film is removed after removing the active semiconductor layer on the element separation area between pixels.

6 Claims, 10 Drawing Sheets

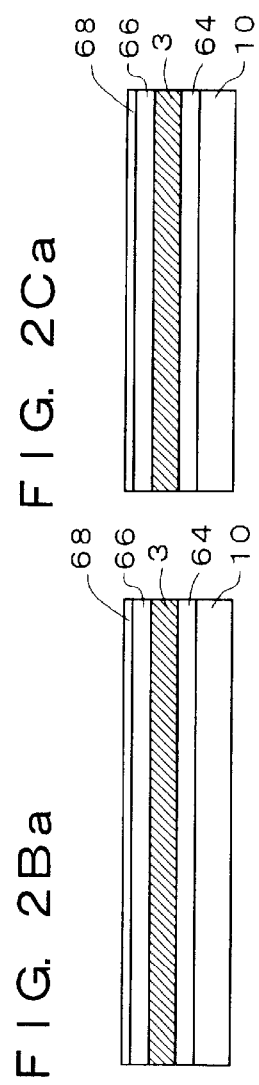
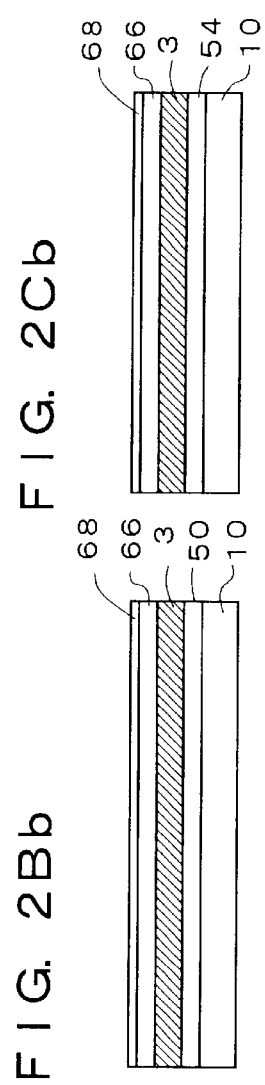
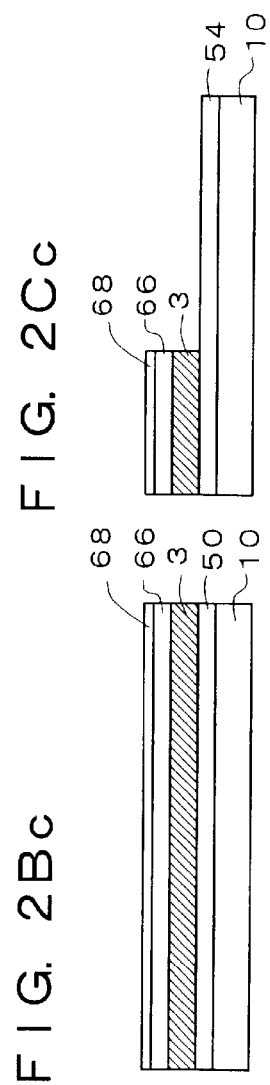

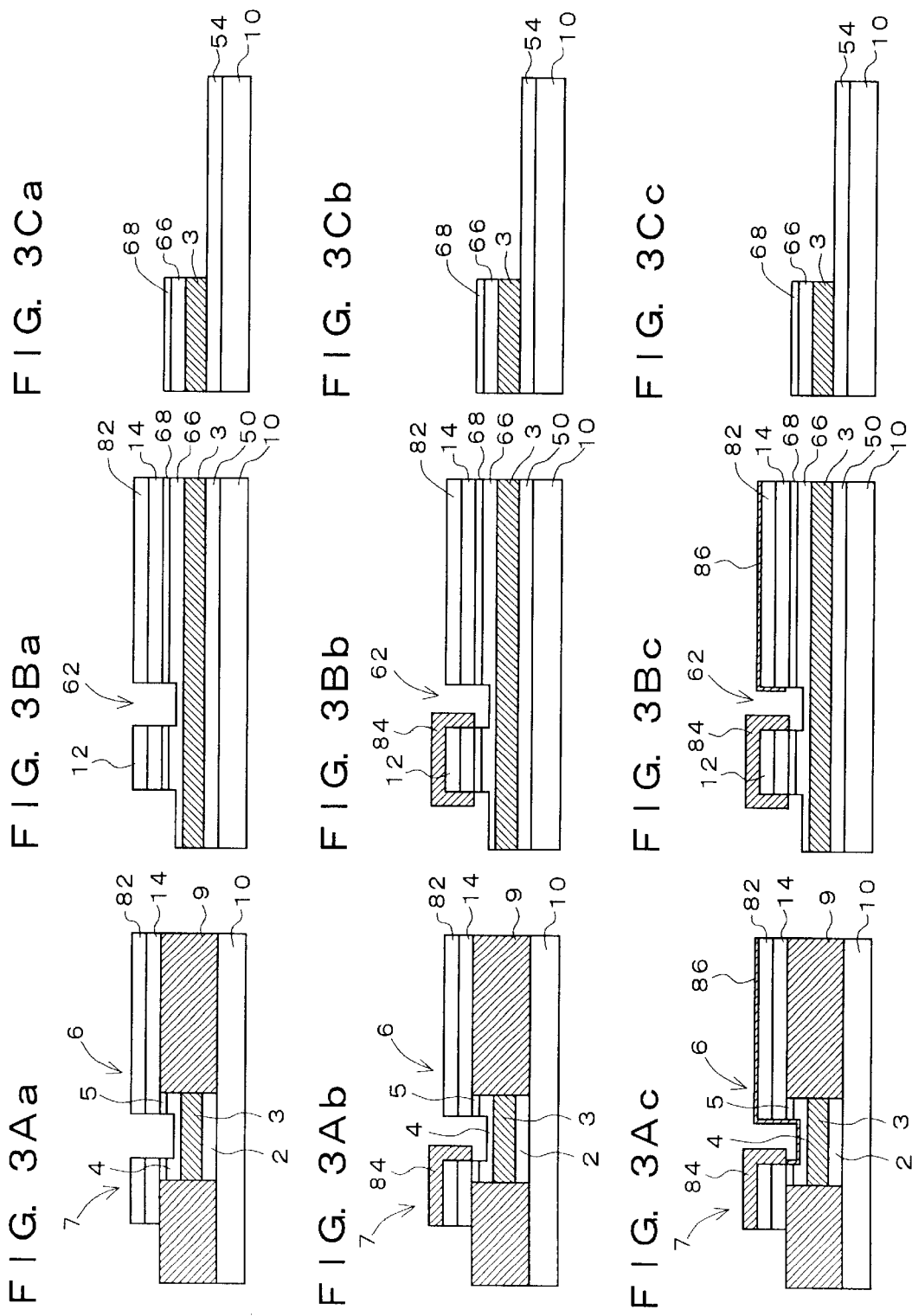

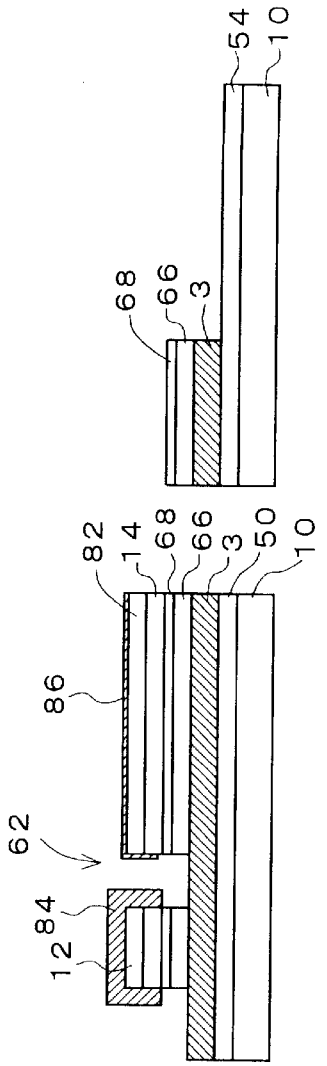
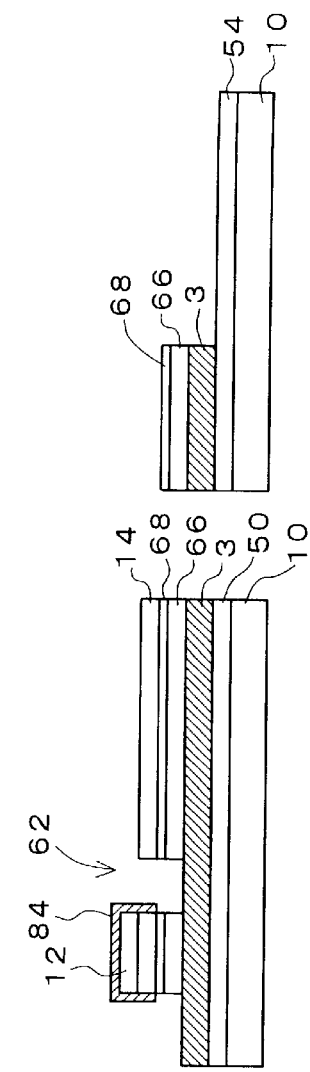

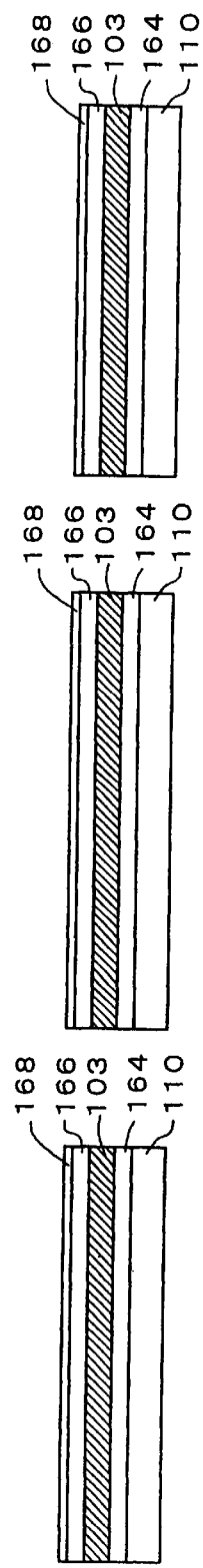
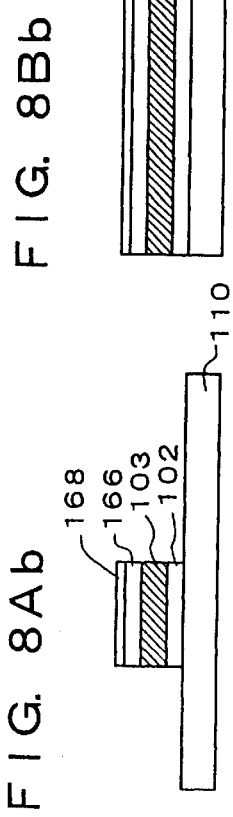
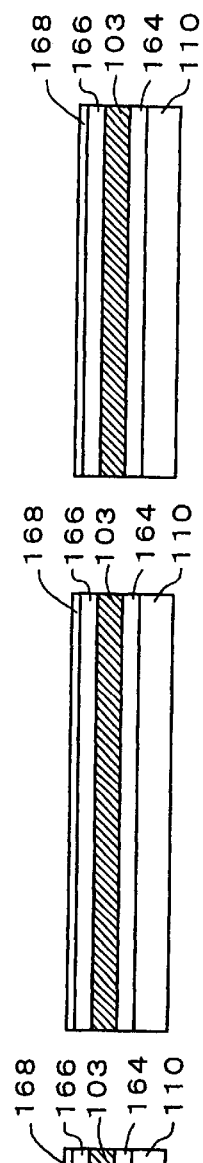
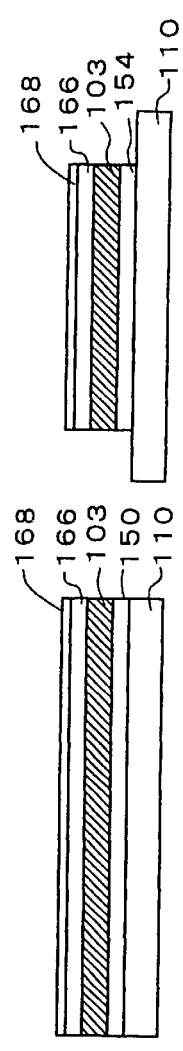
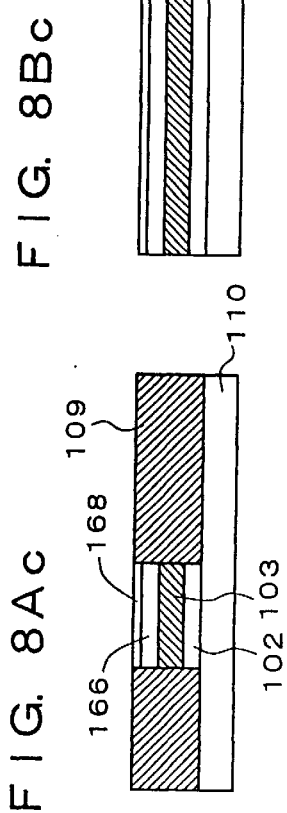
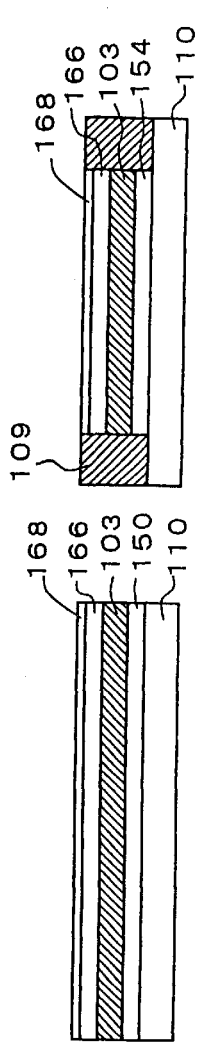
PRIOR ART

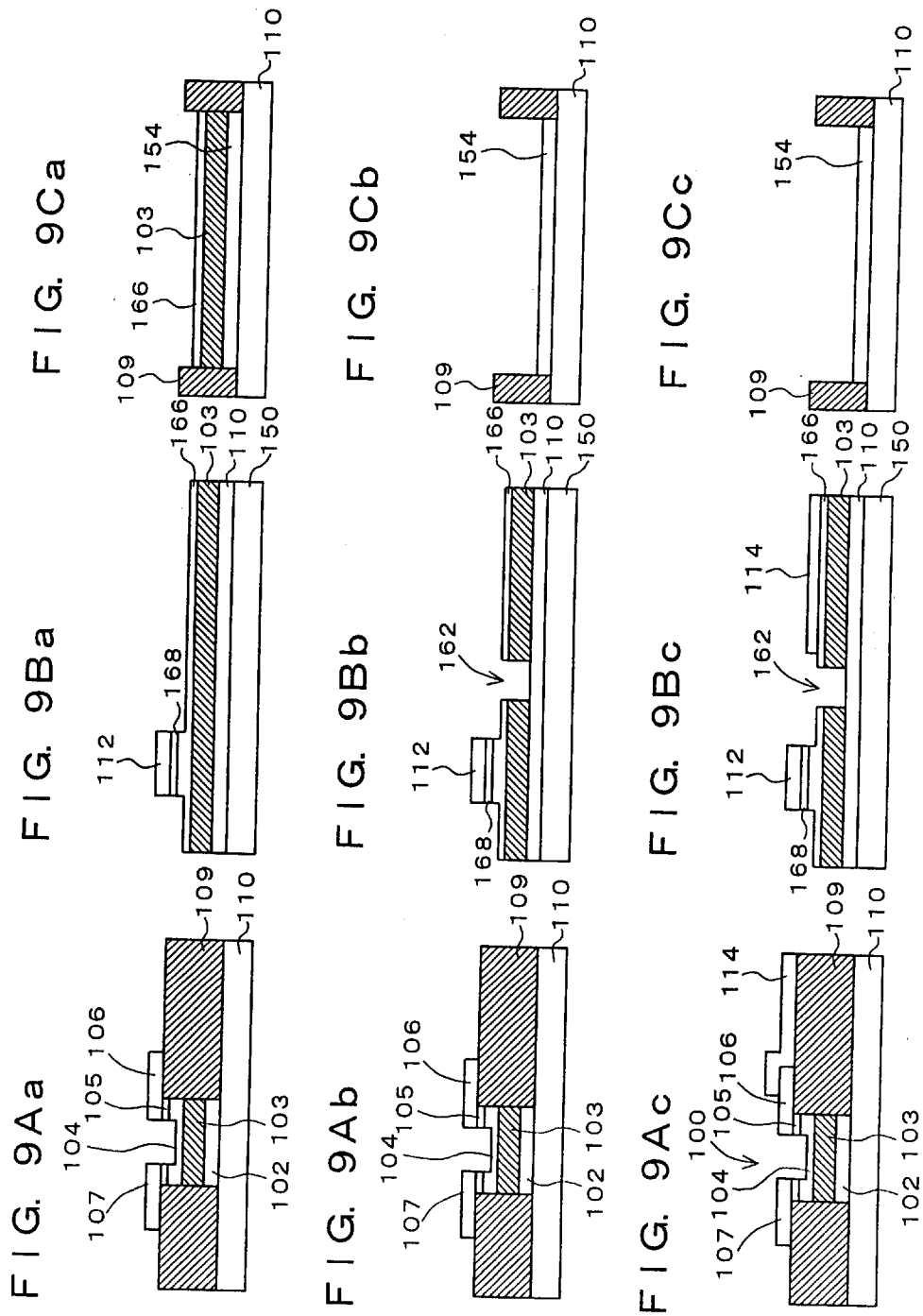

PRIOR ART

US 6,500,700 B1

FABRICATION METHOD OF LIQUID CRYSTAL DISPLAY

BACKGROUND OF THE INVENTION

1. Field of the Invention

The present invention relates to a fabrication method of an active matrix type liquid crystal display having a thin film transistor as a switching element.

2. Description of the Related Art

A liquid crystal display has a feature to be light, a thin type and low power consumption, and is applied to a variety of areas such as a portable terminal, a finder of a video camera, a display of a notebook personal computer. Among them, an active matrix type liquid crystal display can display high quality and fine images, thereby being used for large displays for computers and the like. From now on, the more and more increase of the demands for the active matrix type liquid crystal display leads to the establishment of the fabrication method of the liquid crystal display having a high productivity at a low cost.

The conventional liquid crystal display and the fabrication method thereof are described with reference to FIG. 7 through FIG. 10. First, a schematic structure of the active matrix type liquid crystal display fabricated by the fabrication method of the conventional liquid crystal display is described with reference to FIG. 7. FIG. 7 shows a plan view of the substrate viewing an array substrate from the liquid crystal layer side. In FIG. 7, gate bus lines, the drain bus lines, and external connecting terminal areas of the bus lines for storage capacitors are shown along with the illustration of the pixel areas, omitting the intermediate illustration. As shown in FIG. 7, a plurality of drain bus lines 112 extending in the vertical direction in the diagram are formed on the array substrate. Further, on the array substrate, a plurality of gate bus lines 102 extending in the horizontal direction in orthogonal with the drain bus lines 112 in the diagram are formed. Areas decided by these drain bus lines 112 and gate bus lines 102 are pixel areas.

A sandwiching drain type TFT 100 is formed adjacent to the intersection position between the drain bus line 112 and the gate bus line 102 in each pixel area. A drain electrode 107 of the sandwiching drain type TFT 100 is pulled out from the drain bus line 112 and its edge is positioned on one edge side on an active semiconductor layer 104 (not shown in FIG. 7) on the gate bus line 102. At the same time, the end portion is formed crossing on the gate bus line 102 to prevent the signal mixing from the adjacent drain bus line. This drain electrode structure has a structure which sandwiches the area of the gate bus line 102 functioning as a gate electrode of the TFT 100 in the pixel area between the drain bus line 112 and the drain electrode 107. The active semiconductor layer 104 is formed above the gate bus line 102 and along the gate bus line 102 and ordinary is required to be electrically separated from the active semiconductor 104 of the TFT 100 in the other adjacent pixel area. However, according to such a sandwiching drain electrode structure, there is a merit that the patterning of the active semiconductor layer 104 for the TFT element separation between each pixel is not required and the number of the masks can be reduced in the photolithography process.

A source electrode 106 is formed on the other edge side on the active semiconductor layer 104 to oppose to the drain electrode 107. The source electrode 106 is electrically connected with a pixel electrode 114 formed along a shape of the pixel area. In the TFT structure shown in FIG. 7, the gate electrode is not formed by pulled out from the gate bus line 102. Therefore, the gate bus line 102 area arranged just under the active semiconductor layer 104 at the lower layer of source electrode 106 and the drain electrode 107 functions as the gate electrode 102 of the TFT 100. Although the illustration is omitted, a gate insulating film 103 is formed between the gate bus line 102 and the active semiconductor layer 104 thereon.

At the lower layer of the pixel electrode 114, a storage capacitor wiring 150 is formed in parallel with the gate bus line 102 and crosses substantially the center of the pixel electrode 114. A semiconductor layer (herein after referred to the active semiconductor layer 104 for convenience' sake) is formed simultaneously with the active semiconductor layer 104 at the upper layer of the storage capacitor wiring 150. Therefore, it is required to electrically separate the semiconductor layer from the active semiconductor layer 104 on the storage capacitor wiring 150 in the other adjacent pixel area, and therefore a pixel separation area 162 is formed in an area between the drain bus line 112 and the pixel electrode 114 where the active semiconductor layer 104 is removed.

Further, an external connecting terminal 152 for an electrical connection with an external element is provided at one end portion of the drain bus line 112. Similarly, an external connecting terminal 154 for an electrical connection with an external element is provided at one end portion of the gate bus line 102 and an external connecting terminal 156 is formed at one end portion of the storage capacitor wiring 150. In FIG. 7, a short ring (a common electrode) 158 for an electrical connection between the external connecting terminal 154 of each gate bus line 102 is formed for an electrostatic protection in the fabrication process of the array substrate. Furthermore, a leading electrode 159 for the storage capacitor wirings is formed serving also as a common electrode. Although an illustration is omitted, a short ring electrically connecting each external connecting terminal 152 of the drain bus line 112 is separately formed. The short rings of these drain bus line and gate bus line, for example a short ring 158, are cut at the position of a dashed line 160 in FIG. 7 and separated after the array substrate and the opposing substrate are laminated.

Next, the conventional fabrication method of the liquid crystal display is described with reference to FIG. 8Aa through FIG. 10. FIG. 8Aa through FIG. 9Cc show partial cross sections showing the conventional fabrication process of the liquid crystal display. FIGS. 8Aa, 8Ab, 8Ac, 9Aa, 9Ab and 9Ac show cross sections adjacent to the TFT 100 cut at a line A–A' in FIG. 7. FIGS. 8Ba, 8Bb, 8Bc, 9Ba, 9Bb and 9Bc show cross sections adjacent to the element separation area cut at a line B–B' in FIG. 7. FIGS. 8Ca, 8Cb, 8Cc, 9Ca, 9Cb and 9Cc show cross sections of the external connecting terminal 154 of the gate bus line 102 cut at a line C–C' in FIG. 7.

Now, as shown in FIGS. 8Aa, 8Ba and 8Ca, a metal thin film 164 depositing Al film and a Ti film thereon in this order is formed on a transparent insulating substrate (a transparent glass substrate) 110 of, for example, 0.7 mm in thickness as the array substrate by a sputtering method. Next, the gate insulating film 103 is formed by depositing for example a silicon nitride (SiN) film on the whole substrate surface by a plasma CVD method. Next, for example an amorphous silicon (a-Si) layer 166 for forming the active semiconductor layer 104 is deposited on the whole substrate surface by the plasma CVD method. Further, a $n^+$a-Si layer 168 adding for example phosphorus (P) is formed on the whole substrate surface by the plasma CVD method to form a low resistance semiconductor layer 105 to be an ohmic contact layer.

Next, after resist is coated on the whole surface, the resist is patterned in a shape of the gate bus line and a shape of the storage capacitor wiring using a first resist exposure mask. The layers are etched together up to the metal thin film 164 using chlorine type gas by for example a reactive ion etching using the patterned resist layer (not shown) as a first etching mask, thereby as shown in FIGS. 8Ab, 8Bb and 8Cb areas for the gate bus line 102 and the external connecting terminal 154 of the gate bus line 102, and the leading electrode 159 of the storage capacitor wiring 150 and the external connecting terminal 156 (not shown) are formed along with the storage capacitor wiring 150.

Next, as shown in FIGS. 8Ac, 8Bc and 8Cc, after removing the resist layer, a sidewall insulating film 109 of the gate bus line 102 is formed. After coating for example organic polyimide on the whole substrate surface, this sidewall insulating film 109 is formed by performing an ashing treatment and the like until a surface of a low resistance semiconductor layer 168 exposes.

Next, as shown in FIGS. 9Aa, 9Ba and 9Ca, a metal film (not shown) is formed to form the drain electrode 107, the source electrode 106 and the drain bus line 112 by the sputtering method.

Next, a resist layer patterned in a shape of the source and drain electrodes and a shape of the data bus line is formed by coating a photo-resist on the whole substrate surface and by developing after exposing the resist using a second resist exposure mask. Using the patterned resist layer (not shown) as a second etching mask, the etching treatment is performed to the metal thin film, the n⁺a-Si layer 168 and a amorphous silicon layer 166 in this order. Then, as shown in FIGS. 9Aa, 9Ba and 9Ca, the drain bus line 112, the drain electrode 107, source electrode 106 and the low resistance semiconductor layer to be the ohmic contact layer are formed. In this etching treatment, one part of the upper part of the amorphous silicon layer 166 is also etched and the active semiconductor layer 104 is formed. In this etching, for example a reactive ion etching (RIE) is used and the chlorine type gas is used as an etching gas.

Further, as clear in FIGS. 9Aa, 9Ba and 9Ca, the amorphous silicon layer 166 for forming the gate insulating film 103 and the active semiconductor layer 104 remains at the upper portions of the gate bus line 102 and the external connecting terminal 154 and further at the upper portion of the storage capacity wiring 150 in this stage.

Next, the resist is again coated on the whole substrate surface after removing the resist layer. Then, the resist is developed after an exposure using a third resist exposure mask, thereby a resist layer is patterned in a shape of the element separation area and in a shape of the external connecting terminal. Using the patterned resist layer (not shown) as a third etching mask, the etching treatment is performed to the amorphous silicon layer 166 and the gate insulating film 103. As shown in FIGS. 9Ab, 9Bb and 9Cb, the element separation area 162 cutting the amorphous silicon layer 166 between the elements is formed. Further, the amorphous silicon layer 166 and the gate insulating film 103 on the external connecting terminal 154 are also removed by the etching and terminal surface thereof is exposed.

Next, after depositing a transparent electrode material, for example ITO (Indium Tin Oxide) layer on the whole surface, a photo-resist is coated on the whole substrate surface, developed after exposing the resist using a fourth resist exposure mask, and a resist layer is patterned in a shape of pixel electrode. Using this patterned resist layer (not shown) as a fourth etching mask, the pixel electrode 114 is formed as shown in FIGS. 9Ac, 9Bc and 9Cc by the etching treatment to the ITO layer. After the above processes, the array substrate forming the elements on the glass substrate is completed. A liquid crystal display panel is completed by laminating this array substrate and the opposing substrate after sandwiching liquid crystal.

The schematic fabrication process of the above conventional liquid crystal display is shown in FIG. 10. Steps (a) through (c) in FIG. 10 correspond to FIGS. 8 and steps (d) through (f) in FIG. 10 correspond to FIG. 9. In each process of steps (b), (d), (e) and (f) in FIG. 10, the resist exposure mask is required. In this example, since the TFT 100 has the sandwiching drain type structure, only two mask-processes are required to form the TFT 100. However, in the other processes, totally two masks for the resist exposure are required. One is for forming the etching mask to separate the active semiconductor layer on the storage capacitor wiring for each pixel and the other is for forming the etching mask for the pixel electrode 114. Four masks for the resist exposure are totally required in the whole array process.

Therefore, the depositing process for a predetermined film and the photolithography and etching processes composed of resist coating, resist baking, exposure, developing, etching, resist removing and the like are required for each of this four processes. Generally, such number of lithography processes is expressed by the number of masks and referred as a four-mask process in the above example. In the fabrication method of the liquid crystal display, generally, there is a problem that the more the number of masks used for the photolithography process increases, the more easily the damage due to an attachment of dust and the like occurs, thereby reducing a fabrication yield. Therefore, the number of the photolithography processes are desired to be as less as possible.

With a spread of the recent active matrix type liquid crystal display, more reduction of the fabrication cost is a very important subject to supply a liquid crystal display in the market at a low price and stably. In order to reduce the fabrication cost, first, it is strongly required to improve the fabrication yield of the liquid crystal display. Second, it is also required to increase a throughput in the fabrication of the liquid crystal display. For them, more high degree of depositing processes and the photolithography processes are required than the past along with the simplification of the fabrication processes. However, an introduction of the high performance fabrication equipment may on the contrary lead to an increase in cost. Further, with the current fabrication method, there is a limit to greatly improve the fabrication method and the throughput in front of the requirements for the finer and larger screen liquid crystal display. Further, comparing with the fabrication of the semiconductor equipment, the fabrication cost for masks used in the photolithography processes is higher in the fabrication of the liquid crystal display, thereby resulting in a problem in fabrication cost. However, there is a problem that in front of the requirement of the finer and larger screen of the liquid crystal display, above disadvantage must have been neglected.

SUMMARY OF THE INVENTION

An object of the present invention is to provide a fabrication method of a liquid crystal display which can reduce a fabrication cost.

Another object of the present invention is to provide a fabrication method of a liquid crystal display which can reduce the number of masks used in a photolithography process.

Above objects are achieved by a method of fabricating a liquid crystal display comprising which has features in laminating at least a gate forming metal layer, a gate insulating film, and an active semiconductor forming layer in this order on an insulating substrate, forming gate bus lines and storage capacitor wirings by etching the active semiconductor forming layer, the gate insulating film and the gate forming metal layer by using a first mask, forming a sidewall insulating film of each of the gate bus lines, depositing a transparent electrode material layer on the whole surface and then forming a first metal film thereon, forming drain bus lines, drain electrodes and pixel electrodes serving as source electrodes opposing to the drain electrodes by etching the first metal film and the transparent electrode material layer by using a second mask, forming a second metal film on the first metal film on the drain electrodes and forming a third metal film on the active semiconductor forming layer between the drain electrodes and the source electrodes and on the pixel electrodes by performing an electroplating, removing the active semiconductor forming layer on an element separation area between pixels by etching using the second metal film and the third metal film as a mask, and removing the third metal film.

According to the above structure of the present invention, it is possible to fabricate the array substrate of the liquid crystal display with two masks. After laminating the gate formation metal layer, the gate insulating film, the active semiconductor formation layer, and the low resistance semiconductor layer in this order, no mask is required to be used in the photolithography process other than the process for forming the gate electrodes and the storage capacitor wirings by etching together using the first mask and the process using the second mask for forming the source and drain electrodes. Instead, the present invention has a feature that the active semiconductor film is separated between the pixels and the pixel electrodes is formed using for example the plating and the selective etching.

BRIEF DESCRIPTION OF THE DRAWINGS

FIGS. 2A*a* through 2C*c* are partial cross sectional views showing a fabrication process of the liquid crystal display according to an embodiment of the present invention.

FIGS. 3A*a* through 3C*c* are partial cross sectional views showing a fabrication process of the liquid crystal display according to an embodiment of the present invention.

FIGS. 4A*a* through 4C*b* are partial cross sectional views showing a fabrication process of the liquid crystal display according to an embodiment of the present invention.

FIGS. 8A*a* through 8C*c* are partial cross sectional views showing a fabrication process of the conventional liquid crystal display.

FIGS. 9A*a* through 9C*c* are partial cross sectional views showing a fabrication process of the conventional liquid crystal display.

DESCRIPTION OF THE PREFERRED EMBODIMENTS

Figure 1:
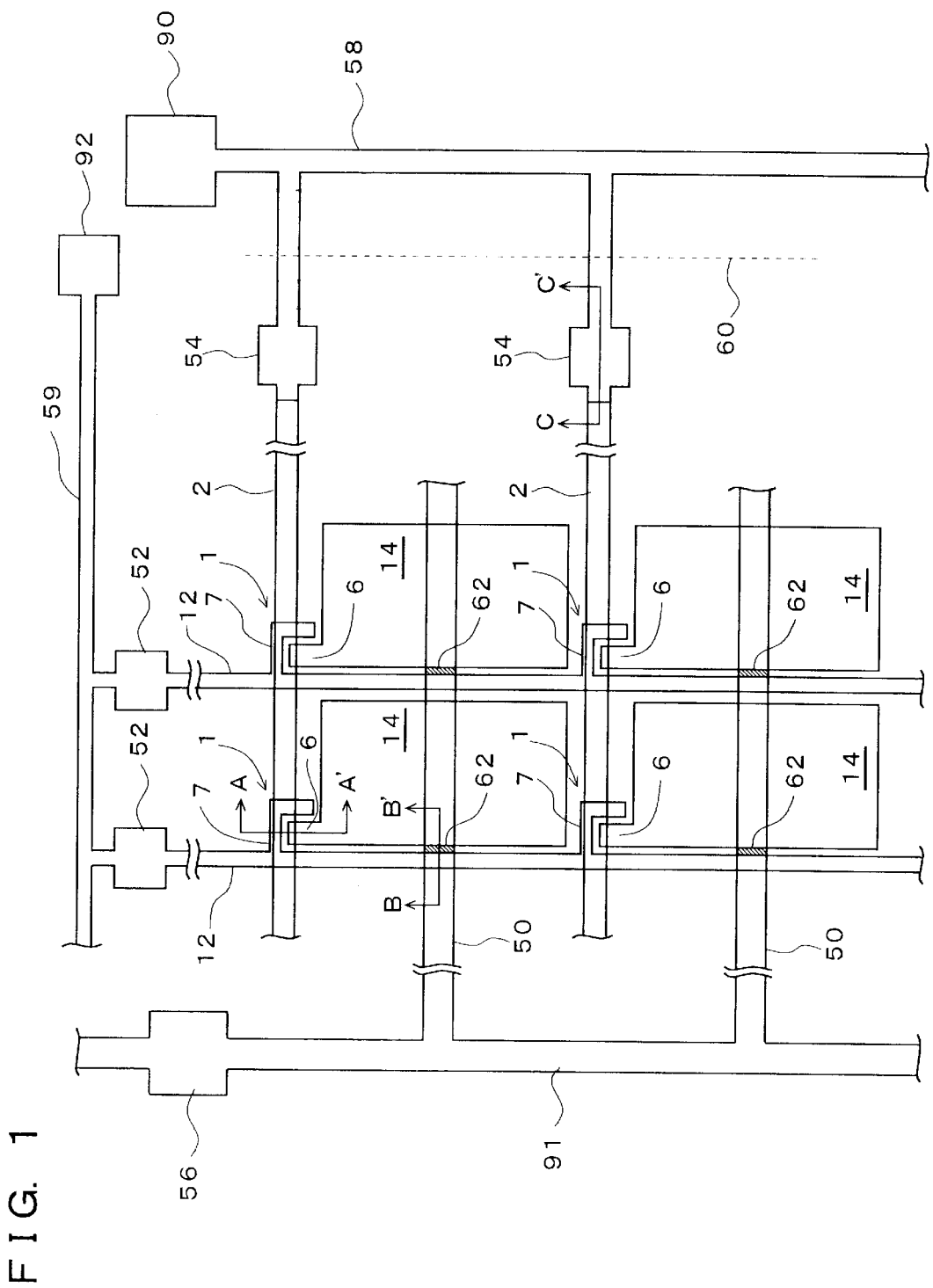
FIG. 1 is a diagram showing a schematic structure of a liquid crystal display fabricated by a fabrication method of the liquid crystal display according to an embodiment of the present invention.

A fabrication method of a liquid crystal display according to an embodiment of the present invention is described with referred to FIG. 1 through FIG. 6. First, a schematic structure of an active matrix type liquid crystal display fabricated by a fabrication method of the liquid crystal display according to this embodiment is described with reference to FIG. 1. FIG. 1 shows a plan view of a substrate viewing an array substrate of the liquid crystal display from the liquid crystal layer side. In FIG. 1, gate bus lines, the drain bus lines, and external connecting terminal areas of the bus lines for storage capacitors are shown along with the illustration of the pixel areas, omitting the intermediate illustration. As shown in FIG. 1, a plurality of drain bus lines 12 extending in the vertical direction in the diagram are formed on the array substrate. Further, a plurality of gate bus lines 2 extending in the horizontal direction in orthogonal with the drain bus lines 12 in the diagram are formed on the array substrate. Pixel areas are decided by these drain bus lines 12 and gate bus lines 2.

A sandwiching drain type TFT 1 is formed adjacent to the intersection position between the drain bus line 12 and the gate bus line 2 in each pixel area. A drain electrode 7 of the sandwiching drain type TFT 1 is pulled out from the drain bus line 12 and its edge is positioned on one edge side on an active semiconductor layer 4 (not shown in FIG. 1) on the gate bus line 2. At the same time its end portion is formed so as to cross on the gate bus line 2 to prevent a signal mixing from the adjacent drain bus line. This drain electrode structure has a structure in which an area of the gate bus line 2 functioning as the gate electrode of the TFT 1 in the pixel area is sandwiched by the drain bus line 12 and the gate electrode 7. The active semiconductor layer 4 is formed above the gate bus line 2 and along the gate bus line 2, and ordinary required to be electrically separated from the active semiconductor layer 4 of the TFT 1 in the other adjacent pixel area. However, according to this sandwiching drain electrode structure, a patterning process of the active semiconductor layer 4 for separating the TFT element between each pixel is not required, thereby having a merit to be able to reduce the number of masks used during a photolithography process.

A source electrode 6 is formed on the other edge side above the active semiconductor layer 4 to oppose to the drain electrode 7. The source electrode 6 is integrated with a pixel electrode formed along a shape of the pixel area using the same forming material. The TFT structure shown in FIG. 1 is formed not to pull out the gate electrode from the gate bus line 2. Therefore, the gate bus line 2 area arranged just below the active semiconductor layer 4 which is under the source electrode 6 and the drain electrode 7 functions as the gate electrode 2 of the TFT 1. Although the illustration is omitted, a gate insulating film 3 is formed between the gate bus line 2 and the active semiconductor layer 4 thereon.

At the lower layer of the pixel electrode 14, a storage capacitor wiring 50 is formed in parallel with the gate bus line 2 and crosses substantially the center portion of a pixel electrode 14. A semiconductor layer (hereinafter referred to the active semiconductor layer 4 for convenience' sake) is simultaneously formed with the active semiconductor layer 4 at the upper layer of the storage capacitor wiring 50. Therefore, it is required to electrically separate the semiconductor layer from the active semiconductor layer 4 on the storage capacitor wiring 50 in the other adjacent pixel area, and therefore pixel separation area 62 is formed between the drain bus line 12 and the pixel electrode 14 where the active semiconductor layer 4 is removed.

Further, an external connecting terminal 52 which electrically connects with the external elements is provided at one end portion of the drain bus line 12. Similarly, an external connecting terminal 54 which electrically connects with the external elements is provided at one end portion of the gate bus line 2, and an external connecting terminal 56 is formed at the storage capacitor wiring 50 via a leading electrode 91. In FIG. 1, a short ring (or a common electrode) 58 which electrically connects between the external connecting terminal 54 of each gate bus line is formed for the electrostatic protection during the fabrication process of the array substrate. Furthermore, the leading electrode 91 for connecting each storage capacitor wiring 50 serves also as the common electrode. A short ring 59 which electrically connects each external connecting terminal 52 of the drain bus lines 12 is also separately formed. Further, an external connecting terminal 90 is formed at one end portion of the short ring 58 and an external connecting terminal 92 is formed at one end portion of the short ring 59. After the array substrate and the opposite substrate are laminated, these short rings 58 and 59, for example the short ring 58, are cut and separated at the position of a dashed line in FIG. 1.

Figure 6:
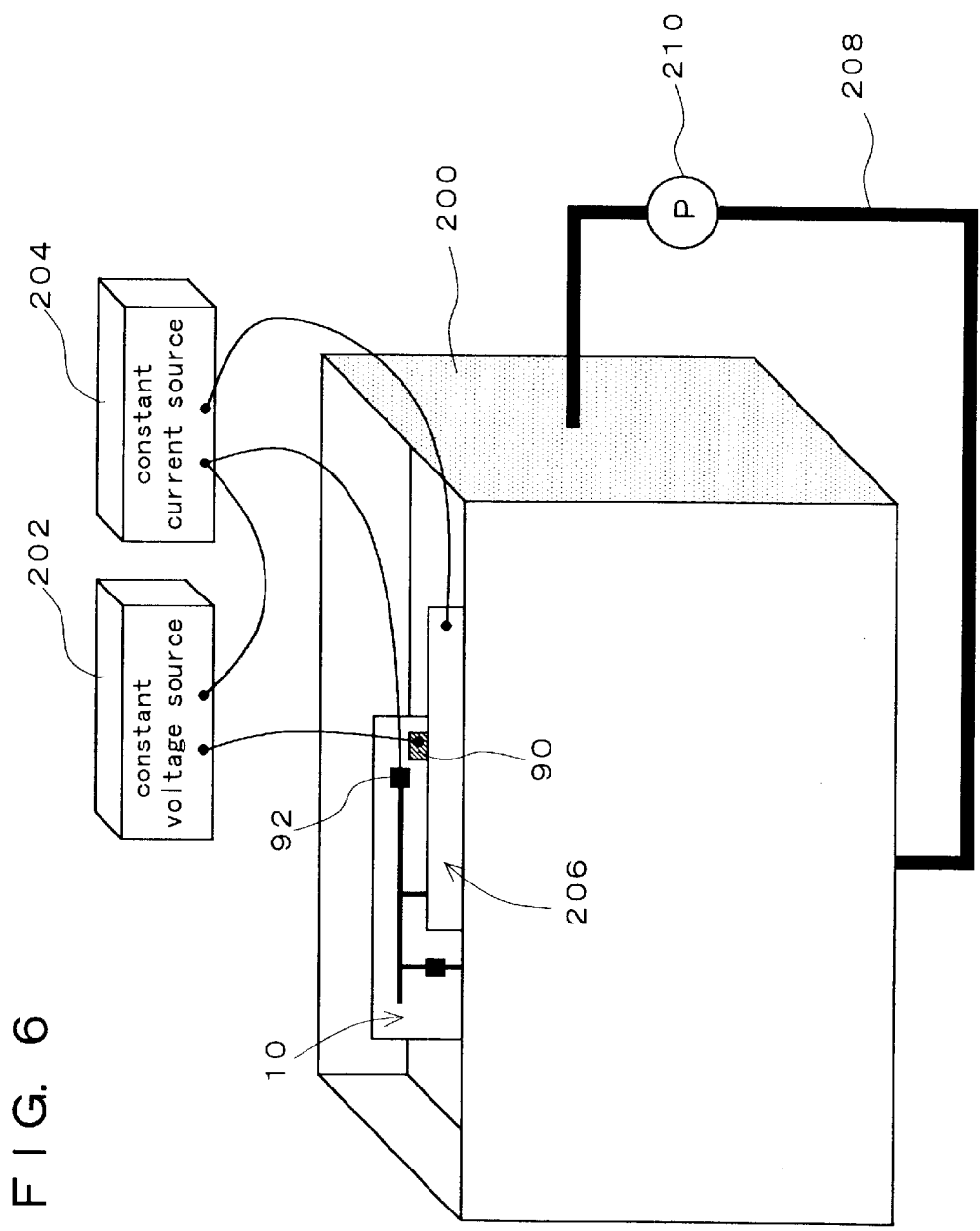
FIG. 6 is a diagram describing a fabrication process of an electroplating in a fabrication process of the liquid crystal display according to an embodiment of the present invention.
Figure 7:
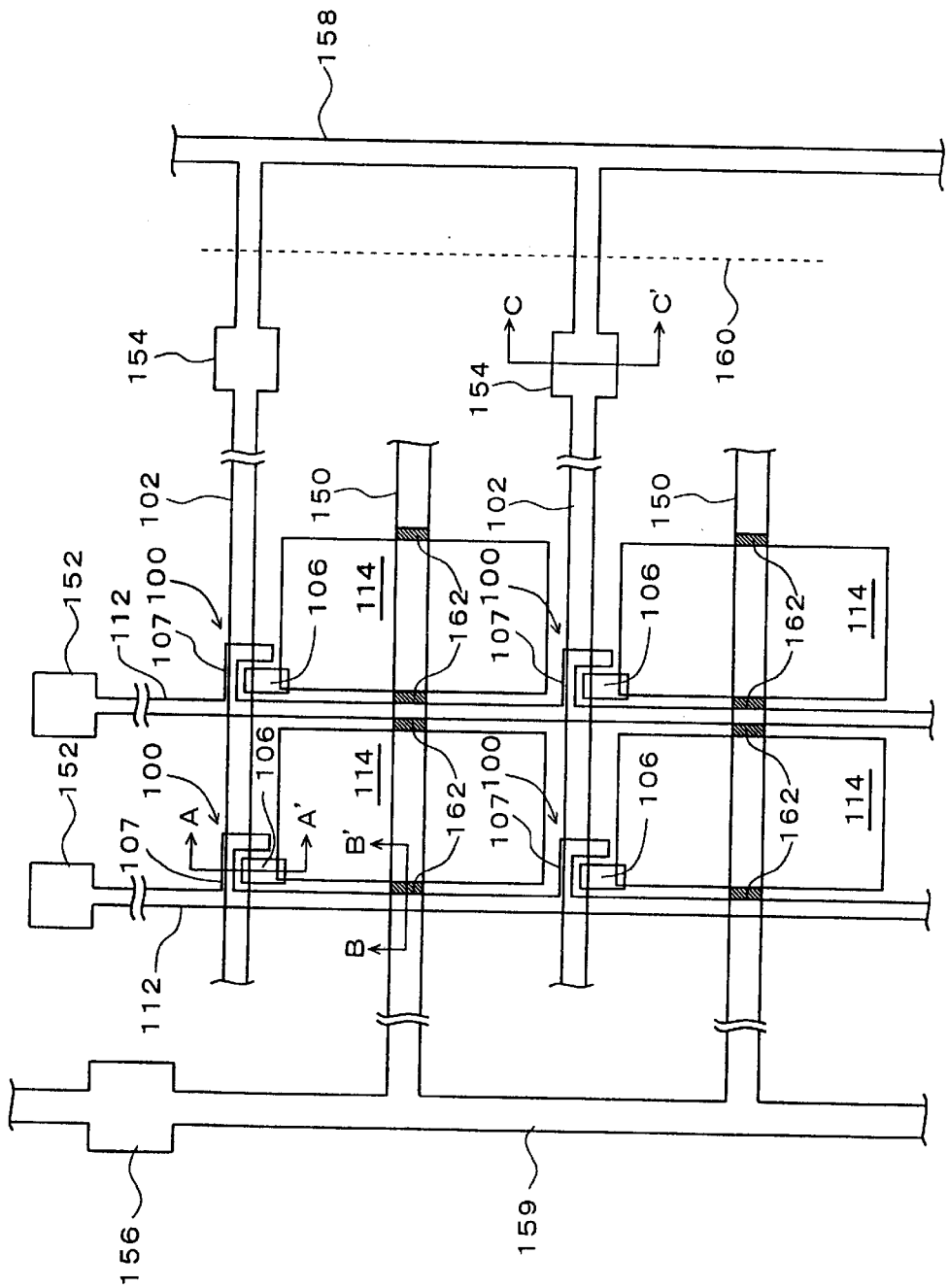
FIG. 7 is a diagram showing a schematic structure of a liquid crystal display fabricated by the fabrication method of the conventional liquid crystal display.
Figure 10:
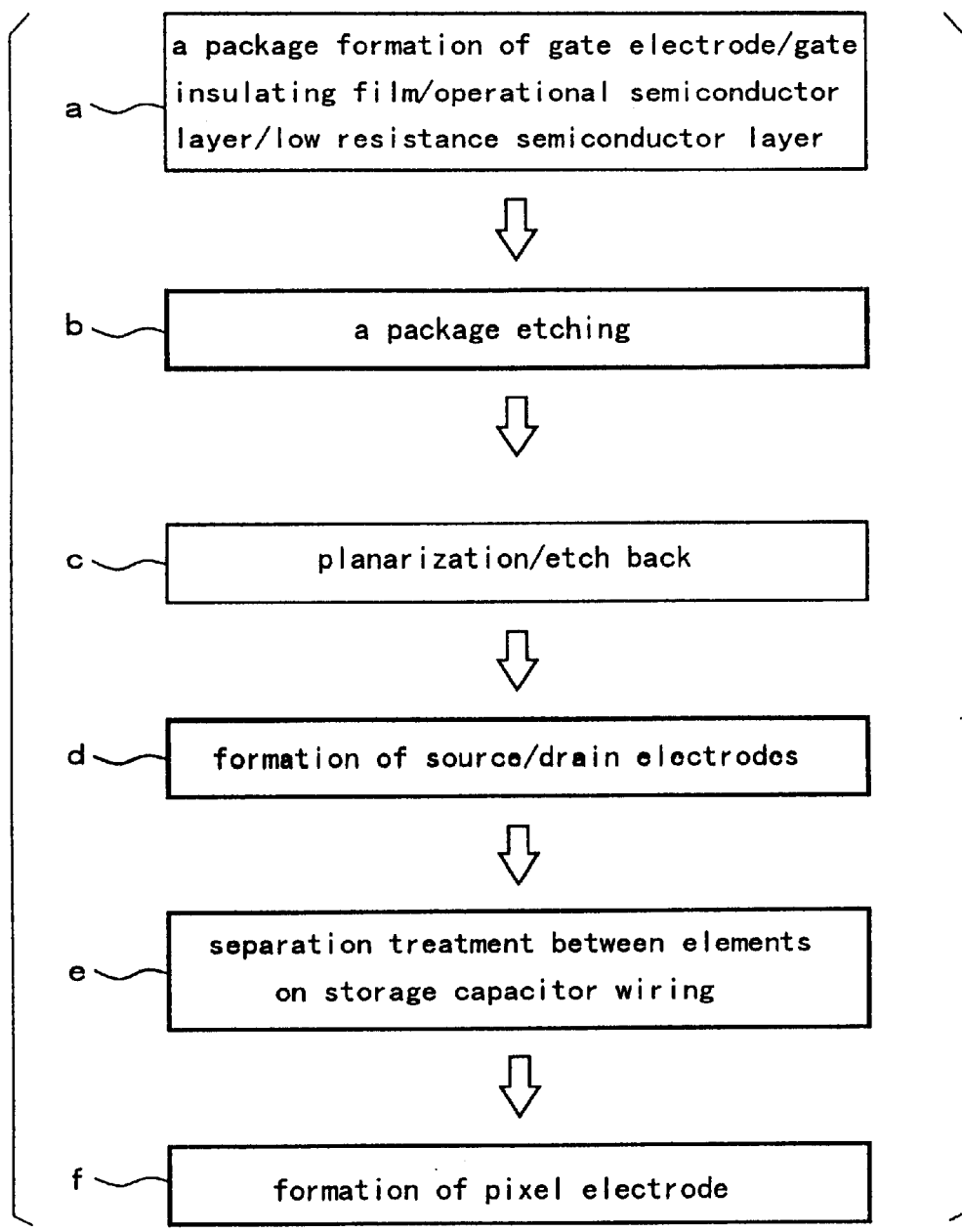
FIG. 10 is a diagram describing a fabrication process of the conventional liquid crystal display.

Next, the fabrication method of the liquid crystal display according to this embodiment shown in FIG. 1 is described with reference to FIG. 2A$a$ through FIG. 6. FIG. 2A$a$ through FIG. 4C$b$ show partial cross sections showing the fabrication processes of the liquid crystal display of this embodiment. FIGS. 2A$a$, 2A$b$, 2A$c$, 3A$a$, 3A$b$, 3A$c$, 4A$a$ and 4A$b$ show cross sections adjacent to the TFT 1 cut at the line A–A' in FIG. 1. FIGS. 2B$a$, 2B$b$, 2B$c$, 3B$a$, 3B$b$, 3B$c$, 4B$a$ and 4B$b$ show cross sections adjacent to a pixel separation area 62 cut at a line B–B' in FIG. 1. FIGS. 2C$a$, 2C$b$, 2C$c$, 3C$a$, 3C$b$, 3C$c$, 4C$a$ and 4C$b$ show cross sections of the external connecting terminal 54 of the gate bus line 2 cut at a line C–C' in FIG. 1.

Now, as shown in FIGS. 2A$a$, 2B$a$ and 2C$a$, a gate forming metal layer 64 depositing Al (Aluminum) thereon using a sputtering method is formed on a array substrate 10 of a transparent insulating substrate (transparent glass substrate) of for example 0.7 mm in thickness. Then, the gate insulating film 3 is formed by depositing for example silicon nitride film (SiN) on the whole substrate surface using a plasma CVD method. Next, for example an amorphous silicon (a-Si) layer 66 for forming the active semiconductor layer 4 is deposited on the whole substrate surface by the plasma CVD method. Further, in order to form a low resistance semiconductor layer 5 to be an ohmic contact layer, for example a n$^+$a-Si layer 68 adding phosphorus of 0.5% is formed on the whole substrate surface by the plasma CVD method. These deposits can be performed in the same vacuum by an equipment structure and it is desired to form at least the gate insulating film 3, the active semiconductor layer 4 and the low resistance semiconductor layer 5 in the same vacuum from the point of operational stability of the elements.

Next, after coating resist on the whole surface, the resist is patterned in a shape of the gate bus line and in a shape of the storage capacitor wiring using a first resist exposure mask. Using the patterned resist layer (not shown) as the first etching mask, areas of the gate bus line 2 and the external connecting terminal 54 of the gate bus line 2, and the leading electrode 91 and the external connecting terminal 56 (not shown) of the storage capacitor wiring 50 are formed as shown in FIGS. 2A$b$, 2B$b$ and 2C$b$ along with the storage capacitor wiring 50 by etching together up to the gate forming metal layer 64 using chlorine type gas by for example a reactive ion etching.

Next, as shown in FIGS. 2A$c$, 2B$c$ and 2C$c$, a sidewall insulating film 9 of the gate bus line 2 is formed after removing the resist layer. An organic insulating film such as for example polyimide is used for this sidewall insulating film 9. After coating polyimide thicker than the laminated pattern on the substrate by a spin coating method and the like, upper portion of the n$^+$a-Si layer 68 is exposed from upper portion to the thickness of the laminated pattern by etching using an oxygen ashing and the like.

Then, areas other than the upper portion of the external connecting terminal 54 of the gate bus line 2 are masked using a metal mask (or ceramics) and the like, an anisotropic etching is performed up to the low resistance semiconductor layer 68, amorphous silicon layer 66 and gate insulating film 3 on the external connecting terminal 54 by a dry etching using a fluorine type gas. However, since Al can not be etched by the fluorine type gas, the external connecting terminal 54 of the Al layer is etched up to the upper surface, thereby exposing the upper surface.

Next, as shown in FIGS. 3A$a$, 3B$a$ and 3C$a$, an ITO film 14 which is the transparent electrode material, and a first metal film 82 made of for example Cr are formed on the whole substrate surface in this order by a sputtering method. Then, after coating the resist on the whole surface and exposing the resist using the second a mask for the resist exposure, the whole surface of the substrate is developed. The resist layer (not shown) patterned in shapes of the drain bus line and the drain electrode, and in shapes of the source electrode and the pixel electrode is then formed. The first metal film 82, the source electrode 6 and the pixel electrode 14, and the drain electrode 7 and the drain bus line 12 are patterned using the patterned resist layer as the second etching mask. Then, etching is performed until the forming area of the TFT 1 shown in FIG. 3A$a$ and the n$^+$a-Si layer 68 in the element separation area 62 shown in FIG. 3B$a$ are completely removed and the amorphous silicon layer 66 exposes. This etching is performed by a chlorine type dry etching. The active semiconductor layer 4 in the area of the TFT 1 is formed by this etching.

When the above processes are completed, the array substrate 10 is dipped into the plating liquid filled in the electroplating tank. FIG. 6 shows the state in which the array substrate 10 is dipped into the plating liquid in an electroplating tank 200. As shown in FIG. 6, the plating liquid can circulate in the electroplating tank 200 by a pipe 208 and a circulating pump 210. The plating liquid is diluted sulfuric solution in which the main component is copper sulfate. The external connecting terminal 90 of the short ring 58 is connected to a positive-pole terminal of a constant voltage power source 202 wherein the external connecting terminal 90 is formed on the array substrate 10 dipped into the plating liquid and to which the gate bus line 2 is connected. Further, the external connecting terminal 92 of the short ring 59 is connected to negative-pole terminals of the constant power source 202 and a constant current source 204 wherein the external connecting terminal 92 is formed on the array substrate 10 and to which the drain bus line 12 is connected.

Furthermore, the storage capacitor wiring 50 is connected to the short ring 59 via the external connecting terminal 56 of the leading electrode 91. In the plating liquid, a Pt (platinum) substrate 206 is arranged at the position opposing the array substrate 10. The Pt substrate is connected to a positive pole of the constant current supply 204.

By the above structure, an electrolytic plating of Cu which is the second metal film is performed using the drain bus line 12 of the array substrate 10 as a cathode in the electroplating tank 200. By performing a plating treatment for three minutes under the condition that the current density is equal to 1 A/m$^2$, a second metal film (Cu) 84 which is thinner than the drain bus line 12 and 0.5 μm in thickness is formed on drain electrode 7 and the drain bus line 12 (referred to FIGS. 3Ab, 3Bb and 3Cb). Further, at an arbitrary timing during this plating treatment, a positive voltage +10 V is applied to the gate electrode 2 for approximately 30 seconds. In short, a voltage making the TFT 1 "ON" is applied to the gate electrode 2 during a shorter time than the total plating time. In this way, a Cu film which is to be a third metal film 86 and 0.05 μm in thickness is formed on the active semiconductor layer 4 on the gate bus line 2 and on the first metal film on the pixel electrode 14 (shown in FIGS. 3Ac, 3Bc and 3Cc). At this time, by setting the storage capacitor wiring 50 and the drain bus line 12 at the same potential, it is possible not to form the Cu film which is the third metal film 86 in the element separation area 62.

Next, an anisotropic etching using the chlorine type gas is performed to the amorphous silicon layer 66 in the element separation area 62 using the second metal film 84 and the third metal film 86 as etching masks. As shown in FIGS. 4Aa, 4Ba and 4Ca, the second metal film 84 and the third metal film 86 prevent the upper surface of the gate bus line. 2, the upper surface of the pixel electrode 14, source and drain electrodes 6 and 7 of the TFT 1, and the active semiconductor layer 4 between the source and drain electrodes 6 and 7 and the like from etching. However, since the amorphous silicon layer 66 in the element separation area 62 on the storage capacitor wiring 50 does not have the protecting film on the layer, the amorphous silicon layer 66 is removed by the etching, thereby performing a separation treatment between the elements on the storage capacitor wiring 50 without the use of the photolithography process.

Next, in order to etch the Cu film which is the third metal film 86, the array substrate 10 is dipped into etching solution including ferric chloride. Along with the etching of the third metal film 86 which is the Cu film of 0.05 μm in thickness, the second metal film 84 on the drain bus line 12 is also etched and the Cu film of approximately 0.3 μm in thickness is remained. After that, the array substrate 10 is dipped into the solution of cerium ammonium nitrate. Cu, ITO, Al, amorphous silicon and the like are not etched in this etching liquid, and only the first metal film 82 which is a Cr film is removed by the etching. Therefore, the surface of the transparent pixel electrode 14 can be exposed and the array substrate 10 is completed (shown in FIGS. 4Ab, 4Bb and 4Cb).

Figure 5:
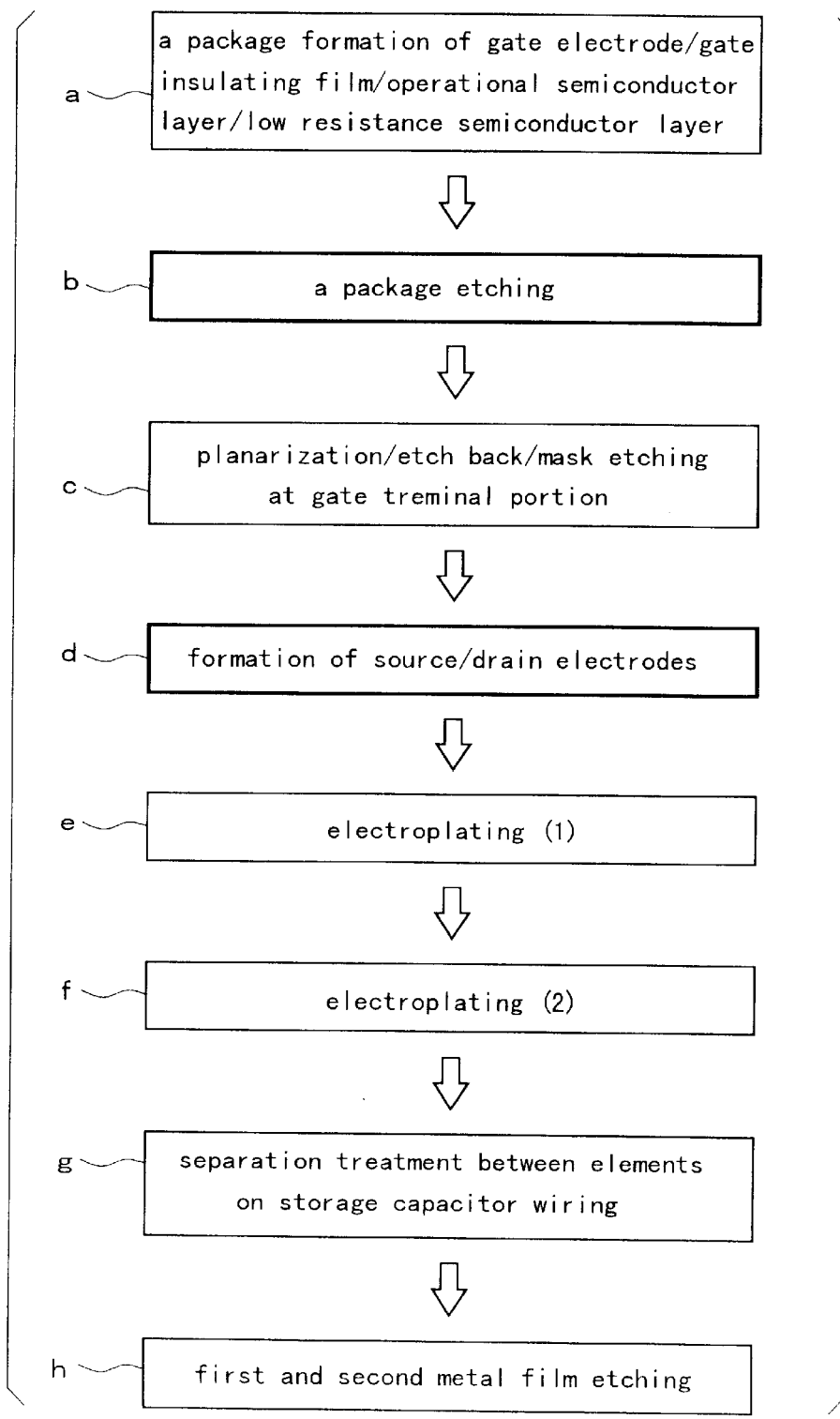
FIG. 5 is a diagram describing a fabrication process of the liquid crystal display according to an embodiment of the present invention.

Brief summarization of the fabrication processes of the liquid crystal display according to this embodiment described above is as shown in FIG. 5. Steps (a) through (c) in FIG. 5 correspond to FIG. 2 in the order. Steps (d) through (f) in FIG. 5 correspond to FIG. 3. Further, steps (g) through (h) in FIG. 5 correspond to FIG. 4 in the order. In FIG. 5, the resist exposure mask is required only in two processes of steps (b) and (d). According to this embodiment as described above, the fabrication of the array substrate of the liquid crystal display can be performed by two masks.

As described above, the fabrication method of the liquid crystal display according to this embodiment has the same point with the conventional fabrication method that the gate electrode and the storage capacitor wiring are formed by etching together using the first mask after laminating the forming metal layer, the gate insulating film, the active semiconductor layer, and the low resistance semiconductor layer in this order. Further, the point that the second mask is used for forming the source and drain electrodes is similar. However, in the processes thereafter, there is a completely different characteristic structural condition from the conventional fabrication method that the conventional third and fourth masks are not required by using the plating and the selective etching replacing the patterning of the element separation and the patterning of the pixel electrode by the photolithography process.

Since the TFT can be fabricated by the simplification of the fabrication process according to this embodiment, the investment for the fabrication can be reduced. Further, since the number of the masks can be minimized to two, high yield can be achieved.

The present invention can be modified variously without limited to the above embodiment.

For example, in the above embodiment, although the sidewall protection film 9 of the organic insulator is used for planarization of the upper surface of the element, the present invention is not limited to this and an inorganic insulator film such as SiN and SiO$_2$ which are the insulating films depositable by the plasma CVD method can be used as the sidewall protection film 9. In the etch back using the inorganic insulator film for the planarization process, fluorine type or chlorine type etching gas can be used. However, since there is a case in which the selective etching character with the low resistance semiconductor layer 5 can not be obtained, it is required to form an etching stopper layer of Ti, Mo, Al and the like beforehand on the low resistance semiconductor layer 5 by a process design.

Further, as this planarization treatment, after coating for example a photo-sensitive polyimide as the photo-sensitive insulating film up to approximately the thickness of the laminated film by utilizing the fact that the gate bus line 2 is opaque, a planarization film can also be formed by performing a back irradiation (exposure) of ultraviolet rays from the back plane of the array substrate 10 and then by developing the polyimide. As this insulating film, not only polyimide but also any material such as acrylic type or novolak type which has basically an insulating character and a negative type photosensitivity can be used.

Further, the purpose of the planarization treatment according to the embodiment above is to make the sidewall of the gate electrode have the insulation character. Therefore, after etching from the low resistance semiconductor layer 5 shown in FIGS. 2Ab, 2Bb and 2Cb to the gate forming metal layer 64 together, the insulating film can be formed on the sidewall of the gate bus line 2 by an anodic oxidation treatment in which the gate bus line 2 is the anode. When the gate bus line 2 is formed with Al, after etching together, only the sidewall of the etched Al is oxidized and secures the insulating character by performing the anodic oxidation in the solution of oxalic acid and the like. The case in which the gate bus line 2 is for example Ta type material such as an anodic oxidation material other than Al can be dealt with similarly.

Further, as a method to obtain the insulating character of the sidewall, the sidewall insulating coat of the gate bus line can also be formed by mixing CO$_2$ and the like of carbonaceous gas into the etching gas when etching from the low resistance semiconductor layer 5 to the gate forming metal layer 64 together.

Furthermore, although Cr is used for the first metal film in the embodiment above, this Cr can be replaced with Ti, Mo or their alloy which can be performed the selective etching between the second metal film and the ITO. Chlorine type gas is mainly used as the etching gas. Further, although Cu is used for the second metal film in the embodiment above, Cr or multi-layer film of Cu and Cr can be used as well.

Further, in the embodiment above, although amorphous silicon is used as the forming material of the active semiconductor layer 4 for description, the present invention is not limited to this and polysilicon can also be used for the active semiconductor layer 4.

As is above, according to the present invention, the fabrication cost can be reduced in the fabrication of the liquid crystal display. Further, according to the present invention, the number of the masks used in the photolithography process in the fabrication of the liquid crystal display can be reduced.

According to the present invention, since the simplified thin film transistor can be structured and fabricated, the investment for the fabrication can be reduced. Further, since the number of required masks can be minimized, the liquid crystal can be fabricated at a high yield.

What is claimed is:

1. A method of fabricating a liquid crystal display, comprising the steps of:
   forming thin film transistors, pixel electrodes and storage capacitor wirings on an insulating substrate, wherein each of the thin film transistors has a gate electrode, a gate insulating film, an active semiconductor layer, a source electrode and a drain electrode, each of the pixel electrodes is connected to each of the source electrodes, and each of the storage capacitor wirings is arranged at under layer of each of the pixel electrodes;
   forming a metal film on the drain electrodes and the pixel electrodes by performing an electroplating;
   removing semiconductor layers formed at the same time as forming the active semiconductor layer and remaining on a plurality of element separation areas formed on the storage capacitor wirings by using the metal film as a mask; and
   removing the metal film at least on the pixel electrodes.

2. A method of fabricating a liquid crystal display as set forth in claim 1, wherein the step of forming the metal film comprises the step of activating the thin film transistors in "on" state while forming the metal film by performing the electroplating.

3. A method of fabricating a liquid crystal display as set forth in claim 2, wherein a film thickness of the metal film on the pixel electrodes is thinner than a film thickness of the metal film on the drain electrodes.

4. A method of fabricating a liquid crystal display as set forth in claim 2, wherein a potential of the storage capacitor wirings is maintained substantially the same as a potential of the drain electrodes while the thin film transistors are at least in "on" state.

5. A method of fabricating a liquid crystal display, comprising the steps of:
   laminating at least a gate forming metal layer, a gate insulating film, and an active semiconductor forming layer in this order on an insulating substrate;
   forming gate bus lines and storage capacitor wirings by etching the active semiconductor forming layer, the gate insulating film and the gate forming metal layer by using a first mask;
   forming a sidewall insulating film of each of the gate bus lines;
   depositing a transparent electrode material layer on the whole surface and then forming a first metal film thereon;
   forming drain bus lines, drain electrodes and pixel electrodes serving as source electrodes opposing to the drain electrodes by etching the first metal film and the transparent electrode material layer by using a second mask;
   forming a second metal film on the first metal film on the drain electrodes and forming a third metal film on the active semiconductor forming layer between the drain electrodes and the source electrodes and on the pixel electrodes by performing an electroplating;
   removing the active semiconductor forming layer on an element separation area between pixels by etching using the second metal film and the third metal film as a mask; and
   removing the third metal film.

6. A method of fabricating a liquid crystal display as set forth in claim 5, wherein the first metal film is made of any one of Cr, Ti, Mo or an alloy thereof.

* * * * *